United States Patent
Stephan

(10) Patent No.: US 9,255,038 B2
(45) Date of Patent: Feb. 9, 2016

(54) BODY MADE OF A CERAMIC MATERIAL

(75) Inventor: Marc Stephan, Basel (CH)

(73) Assignee: STRAUMANN HOLDING AG, Basel (CH)

( * ) Notice: Subject to any disclaimer, the term of this patent is extended or adjusted under 35 U.S.C. 154(b) by 314 days.

(21) Appl. No.: 13/574,643

(22) PCT Filed: Mar. 11, 2011

(86) PCT No.: PCT/EP2011/001205
§ 371 (c)(1),
(2), (4) Date: Jul. 23, 2012

(87) PCT Pub. No.: WO2011/120628
PCT Pub. Date: Oct. 6, 2011

(65) Prior Publication Data
US 2013/0011610 A1   Jan. 10, 2013

(30) Foreign Application Priority Data
Mar. 31, 2010   (EP) .................................... 10003578

(51) Int. Cl.
| | |
|---|---|
| *B32B 5/00* | (2006.01) |
| *B05D 3/02* | (2006.01) |
| *B32B 3/00* | (2006.01) |
| *C04B 35/00* | (2006.01) |
| *C04B 35/48* | (2006.01) |
| *C04B 41/88* | (2006.01) |
(Continued)

(52) U.S. Cl.
CPC ............... *C04B 41/88* (2013.01); *C04B 35/486* (2013.01); *C04B 41/009* (2013.01); *C04B 41/5045* (2013.01); *C04B 41/515* (2013.01); *C04B 41/87* (2013.01); *C04B 2111/00836* (2013.01); *C04B 2235/3225* (2013.01); *C04B 2235/3229* (2013.01); *C04B 2235/40* (2013.01); *C04B 2235/614* (2013.01); *C04B 2235/75* (2013.01); *C04B 2235/76* (2013.01); *Y10T 428/24355* (2015.01); *Y10T 428/265* (2015.01)

(58) Field of Classification Search
CPC ....... C04B 41/87; C04B 41/5045; C04B 35/48
USPC ............................ 428/141, 336; 501/134, 152
See application file for complete search history.

(56) References Cited

U.S. PATENT DOCUMENTS

| | | | |
|---|---|---|---|
| 5,122,317 A | 6/1992 | Chen et al. | |
| 5,834,070 A * | 11/1998 | Movchan et al. | ............. 427/566 |

(Continued)

FOREIGN PATENT DOCUMENTS

| | | |
|---|---|---|
| DE | 202006002232 U1 | 4/2006 |
| EP | 1 632 585 A2 | 3/2006 |

(Continued)

OTHER PUBLICATIONS

International Search Report and Written Opinion mailed Jun. 28, 2011 in corresponding PCT/EP2011/001205.

(Continued)

*Primary Examiner* — Laura Auer
(74) *Attorney, Agent, or Firm* — Oliff PLC

(57) ABSTRACT

A body made of a ceramic material stabilized by a stabilizing agent, characterized in that the body comprises a surface region extending from the surface of the body to a predetermined depth, the stabilizing agent being enriched in said surface region.

17 Claims, 2 Drawing Sheets

(51) Int. Cl.

| | | |
|---|---|---|
| *C04B 35/486* | (2006.01) | |
| *C04B 41/00* | (2006.01) | |
| *C04B 41/50* | (2006.01) | |
| *C04B 41/51* | (2006.01) | |
| *C04B 41/87* | (2006.01) | |
| *C04B 111/00* | (2006.01) | |

(56) References Cited

U.S. PATENT DOCUMENTS

| | | | |
|---|---|---|---|
| 6,102,656 A * | 8/2000 | Nissley et al. | 415/174.4 |
| 6,165,925 A | 12/2000 | Rieger | |
| 2005/0187638 A1 * | 8/2005 | Glien et al. | 623/23.56 |
| 2005/0272008 A1 * | 12/2005 | Stites | 433/180 |
| 2006/0121206 A1 | 6/2006 | Jiang | |
| 2008/0213725 A1 | 9/2008 | Adilstam | |
| 2013/0190164 A1 * | 7/2013 | Ito et al. | 501/134 |

FOREIGN PATENT DOCUMENTS

| | | |
|---|---|---|
| EP | 1 982 670 A1 | 10/2008 |
| JP | H11-228221 | 8/1999 |

OTHER PUBLICATIONS

Chevalier et al., J. Am. Ceram. Soc. , 92 (9), 1901-1920 (2009).
Huang et al., Journal of the European Ceramic Society 25 (2005), pp. 3109-3115.
Settu et al., Journal of the European Ceramic Society 16 (1996), pp. 1309 to 1318.
Makishima et al., J. Am. Ceram. Soc., 69 (6), 1989, C-127-C-129.
Bourell et al., J. Am. Ceram., Soc, 76 (3), 1993, pp. 705-711.
Miyazawa et al., J. Am. Ceram. Soc., 78 (2), 1995, pp. 347-355.
Zhang et al., Chem., Mater. 1999, 11, pp. 148-153.
Toraya et al., J. Am Ceram. Soc., 1984, 67: 119-21.
Yoshimura et al., J. Am. Ceram. Soc. 69[7], 1986, pp. 583-584.

* cited by examiner

BODY MADE OF A CERAMIC MATERIAL

FIELD OF THE INVENTION

The present invention relates to a body made of a ceramic material stabilized by a stabilizing agent, to a process for preparing said body, and to the use of the body as an implant, in particular a dental implant.

BACKGROUND

Dental implants which are currently in use are in general made of a metal, e.g. titanium, or a ceramic, e.g. a zirconia based ceramic.

In contrast to metal implants, which are dark and therefore mismatch with the color of natural teeth, ceramic materials have the advantage that their color can be closely matched to the natural tooth color. Efforts have thus been made to provide dental implants, of which at least the parts that are visible after insertion are made of a ceramic material.

Despite their favourable properties with regard to the color, the use of ceramic materials for dental implants is in many cases limited by their fatigue stability, which is generally rather low.

A ceramic material having a high mechanical strength is disclosed in U.S. Pat. No. 6,165,925, which relates to an yttrium oxide-stabilized zirconium oxide in predominantly tetragonal form (yttria-stabilized tetragonal zirconia; Y-TZP) for the production of a sintered semi-finished article.

Despite its favourable mechanical properties, in particular its high strength, toughness and wear resistance, yttria-stabilized tetragonal zirconia (Y-TZP) has however a propensity to low-temperature degradation (LTD) in the presence of moisture, as for example described by Chevalier et al., J. Am. Ceram. Soc., 92 (9), 1901-1920 (2009).

Low-temperature degradation is a kinetic phenomenon in which polycrystalline tetragonal zirconia transforms to monoclinic zirconia over a rather narrow but important temperature range, typically from room temperature to about 400° C.

The degradation progresses from the surface of the material to its interior and is accompanied by micro- and macro-cracking, thus resulting in reduced fracture strength of the material.

This problem, which is also referred to as "low hydrothermal stability", is particularly relevant for the use of zirconia for dental implants, as thereby the material is exposed to a humid and warm environment and needs to fulfil relatively strict safety requirements over a long period.

In addition, dental implants are often subjected to a subtractive treatment in order to improve its osteointegrative properties. In this regard, EP-A-1 982 670, for example, relates to a process for providing a topography to the surface of a dental implant made of a ceramic material, wherein at least a part of the surface is etched with an etching solution comprising hydrofluoric acid. Etching of the ceramic material has however been found to often go along with a further deterioration of its hydrothermal stability.

For improving its hydrothermal stability, it has been suggested to dope yttria-stabilized zirconia with a suitable amount of ceria. In this regard, it is referred to Huang et al. Journal of the European Ceramic Society 25 (2005), pp. 3109-3115 and to Settu et al., Journal of the European Ceramic Society 16 (1996), pp. 1309 to 1318, both referring to yttria-ceria-stabilized zirconia.

Yttria-ceria-stabilized zirconia has however the disadvantage that it is darker in colour than yttria-stabilized zirconia. This is particularly disadvantageous if the material is used for a dental implant, which preferably has a light colour matching with the natural tooth colour. Further, yttria-ceria-stabilized zirconia has the disadvantage that it is not suitable for being subjected to hot-isostatic pressing (HIP) after sintering. Thus, the strength obtainable for yttria-ceria-stabilized zirconia is lower compared to yttria-stabilized zirconia.

Alternatively, a homogenous dispersion of $Al_2O_3$ grains into a tetragonal yttria-stabilized zirconia matrix has been reported to increase the hydrothermal stability of the tetragonal phase, as for example stated in the above mentioned article of Huang et al. However, also the doping with alumina has a negative impact on the translucency of yttria-stabilized zirconia.

SUMMARY OF THE INVENTION

Considering the shortcomings of known stabilized ceramic materials, and in particular yttria-stabilized zirconia, the problem of the present invention is thus to provide a body made of a ceramic material, said body having an improved hydrothermal stability, i.e. an improved long-term stability under warm and humid conditions, by maintaining the mechanical and visual properties of the ceramic material on which the body is based.

The present invention thus relates to a body made of a ceramic material stabilized by a stabilizing agent. According to the invention, the body comprises a surface region extending from the surface of the body to a predetermined depth, the stabilizing agent being enriched in said surface region.

The surface region thus reaches from the surface down to a depth, which can vary depending on the specific purpose of the body.

The term "enriched" as used in the context of the present invention relates on the one hand to the case where in the surface region the proportion of stabilizing agent of the ceramic material is higher than in the remainder of the body. Since the stabilizing agent may also be enriched starting from the surface region having a lower proportion of stabilizing agent than the remainder of the body, the term "enriched" may also relate to the case wherein in the surface region the proportion of stabilizing agent is as high as in the remainder of the body.

The term "proportion" as used in the context of the present invention relates to the atomic percentage or molar percentage of the stabilizing agent in atomic or oxidic form, respectively, relative to the total number of atoms or molecules, respectively, of the ceramic material.

Since only the surface region is enriched in the stabilizing agent, the other mechanical properties of the ceramic material—apart from the hydrothermal stability—can be kept essentially unchanged. In particular, the strength, toughness and wear resistance of e.g. yttria-stabilized tetragonal zirconia can be maintained. Also, the visual appearance of the body can be kept essentially unchanged.

According to a preferred embodiment of the present invention, the surface region extends from the surface of the body to a depth of at least 20 nm, more preferably at least 50 nm, most preferably at least 100 nm, thus providing an especially high hydrothermal stability. In order not to interfere with the mechanical, visual and osteointegrative properties of the body, the surface region extends from the surface of the body to a depth of less than 10 μm (micrometer), more preferably less than 5 μm (micrometer), most preferably less than 1 μm (micrometer). The surface region thus preferably extends to a depth ranging from 20 nm to 10 μm, more preferably 50 nm to 5 μm, and most preferably from 100 nm to 1 μm.

As will be explained in detail below, enrichment of the stabilizing agent in the surface region of the body can be achieved by a very straightforward process comprising the steps of applying a stabilizing agent to the surface of a basic body and heating the basic body with the stabilizing agent applied thereon at a temperature such that at least a portion of the stabilizing agent diffuses into the ceramic material in which it is integrated. In the body obtained, the proportion of the stabilizing agent of the ceramic material typically increases continuously from the predetermined depth to the surface.

The enrichment in the stabilizing agent can be achieved by the same stabilizing agent or a different stabilizing agent than the one of the basic body. Preferably, the stabilizing agent applied is the same as the one of the basic body, as thereby no further component is introduced.

The basic body is typically prepared by a sintering process. Sintering processes for achieving a ceramic body, and in particular a ceramic dental implant, are known to a skilled person.

In order to provide osteointegrative properties to the body, which is of particular relevance if the latter is used as a dental implant, at least a part of the surface of the body has a surface roughness. As mentioned above, the process for providing a surface roughness typically includes etching of the surface, which might lead to a deterioration of the hydrothermal stability of the body. In this context, it is referred to Journal of the American Ceramic Society, 69 [7] 583-84 (1986), according to which in acidic solutions, the selective dissolution of yttrium components is accelerated because yttrium ion is more basic than zirconium ion. According to the present invention, the deterioration of the hydrothermal stability can be reversed by enriching the stabilizing agent in the surface region; the body is thus re-stabilized.

Given the fact that the stabilizing agent diffuses into the ceramic material and is thereby integrated in the material, there is no discrete coating and thus no discrete boundary between the stabilizing agent applied and the basic body. Consequently, there is no splitting off of the stabilizing agent applied, as it is typically seen when a separate coating of an additional material is applied on a ceramic body.

In principle, the invention relates to any ceramic material stabilized by a stabilizing agent. Specifically, the stabilizing agent is preferably selected from the group of yttrium, cerium and their respective oxides.

More specifically, the body of the present invention is preferably made of a ceramic material comprising yttria-stabilized zirconia. In general, the yttria-stabilized zirconia used is tetragonal in phase. As mentioned above, yttria-stabilized tetragonal zirconia has a very high strength, a high toughness and a good wear resistance. In addition, the material has a light colour which can be closely adapted to natural tooth colour.

Other stabilized ceramic materials, such as an alumina based ceramic material, to which the present invention also relates, are known to the skilled person. In this regard, the skilled person is also aware of stabilizing agents other than the ones mentioned above. For example, calcium, indium, lanthanum and/or scandium as well as their respective oxides can be used as a stabilizing agent, depending on the ceramic material used and the purpose to be achieved. In this regard, it is also referred to the article of Chevalier mentioned above, indicating e.g. magnesium as further stabilizing agent. Apart from magnesium or magnesium oxide, also e.g. calcium or calcium oxide can be used as a stabilizing agent. Further stabilizing agents include for example $Ga^{3+}$, which is also mentioned in the article of Chevalier. All these stabilizing agents are encompassed by the term "stabilizing agent" used in the context of the present invention.

As will be shown in detail below, the crystal structure of the ceramic material in the surface region of the body according to the present invention is typically such that the proportion of monoclinic phase is at most as high as in the remainder of the body. More specifically, the proportion of monoclinic phase is preferably less than 20%. This is in contrast to known ceramic bodies having no surface region enriched in stabilizing agent, since the transformation from tetragonal to monoclinic phase typically begins at the surface of the body, as for example explained by the above mentioned article of Chevalier et al. A suitable method for determining the proportion of monoclinic phase is specified in the context of the examples given below.

Apart from the body defined above, the present invention further relates to a process for preparing the body, said process comprising the steps of applying a stabilizing agent to the surface of a basic body made of a ceramic material and heating the basic body with the stabilizing agent applied thereon at a temperature such that at least a portion of the stabilizing agent diffuses into the ceramic material.

As mentioned above, the basic body is preferably made of a ceramic material comprising yttria-stabilized zirconia, but in no way limited thereto. The basic body is typically prepared by a sintering process known to the skilled person.

In order to achieve a sufficient diffusion of the stabilizing agent into the ceramic material, a sufficient temperature below the sintering temperature is preferably chosen. The actual temperature depends on the specific ceramic material and the stabilizing agent used. A person skilled in the art who has become aware of the present invention knows how to set this temperature.

As mentioned above, osteointegrative properties, which are of particular relevance if the body is used as a dental implant, can be achieved by providing a surface roughness to the body. According to the present invention, the process thus preferably comprises the step of roughening at least a part of the surface of the basic body by a subtractive treatment before applying the stabilizing agent.

As also mentioned above, a body having specifically high osteointegrative properties is obtained, if the subtractive treatment comprises an etching step. It is thereby particularly preferred that the etching step is carried out with an etching solution comprising hydrofluoric acid at a temperature of at least 70° C. By this treatment, discrete grains or agglomerates of grains are removed from the bulk ceramic material, whereby a surface having recesses and cavities is formed, thus leading to a "microscopic" surface roughness. A detailed description of this etching step is given in EP-A-1982670, in particular paragraphs [0024] to [0030], [0060] to and [0079] to [0081], the disclosure of which is hereby incorporated by reference.

It is further preferred that the subtractive treatment further comprises a sand-blasting step prior to the etching step. Thereby, a "macroscopic" surface roughness is obtained, which in combination with the "microscopic" surface roughness mentioned above further contributes to the high osteointegrative properties of the body.

According to another preferred embodiment of the process of the present invention, the stabilizing agent is applied to the surface of the basic body by a sol-gel process, in particular a dip-coating process, by chemical vapour deposition, by physical vapour deposition and/or by ion implantation.

Regarding the applying of the stabilizing agent by a sol-gel process, it is hereby referred to Makishima et al., J. Am. Ceram. Soc., 69 (6), 1989, C-127-C-129, who describe the preparation of $CeO_2$—$TiO_2$ coatings by a sol-gel dip-coating process. The process is applicable to other stabilizing agents, such as yttria.

In analogy, it is further referred to the article of Settu et al. specified above, who describe a sol-gel process for preparing $Y_2O_3$—$ZrO_2$ and $Y_2O_3$—$CeO_2$—$ZrO_2$ powders by adding oxalic acid to the mixed solutions of the metal salts at room temperature and to Bourell et al., J. Am. Ceram. Soc., 76 (3), 1993, pp. 705-711, who describe the sol-gel synthesis of nanophase yttria-stabilized tetragonal zirconia using zirconium tetrachloride and hydrated yttrium chloride precursors.

Further, Miyazawa et al., J. Am. Ceram. Soc., 78 (2), 1995, p. 347-55 describe the dip-coating of a zirconia sol on a substrate.

Regarding the applying of the stabilizing agent in oxidic form, in particular yttria, by chemical vapour deposition (CVD), it is hereby referred to Zhang et al, Chem. Mater. 1999, 11, 148-153, who describe the preparation of yttrium-oxide thin films by catalyst-enhanced chemical vapour deposition using oxygen as carrier gas.

The disclosure of the mentioned articles by Miyazawa et al., Bourell et al., Settu et al., Makishima et al. and Zhang et al. is hereby incorporated by reference.

In view of the process described above, the present invention also relates to a body obtainable by said process.

According to a further aspect, the present invention also relates to a body made of a ceramic material stabilized by a stabilizing agent, characterized in that the body comprises a surface region extending from the surface of the body to a predetermined depth, the amount of monoclinic phase of the crystal structure of the ceramic material being reduced in said surface region.

Specifically, the present invention relates according to this aspect to a body, wherein in the surface region the proportion of monoclinic phase of the crystal structure is at most as high as in the remainder of the body.

As mentioned above, the object achieved by the present invention is particularly useful in the field of implantology, in particular in oral implantology. The present invention thus further relates to the use of the body as an implant, in particular a dental implant.

The present invention is further illustrated by way of the following examples:

EXAMPLES

Preparation of Discs

Discs of yttria-stabilized zirconia (ZIOLOX® MZ111 HIP of CeramTec AG; AZP 2009-0315) having a thickness of about 1 mm and a diameter of about 5 mm were prepared by cutting a rod made of said material. The discs were then etched in an etching solution comprising hydrofluoric acid (40%) at 95° C. for 10 minutes.

Coating of Discs

The discs were then coated with cerium, cerium oxide, yttrium, and yttrium oxide, respectively, using gas flow sputtering. Gas flow sputtering was performed in a vacuum chamber having a volume of 80 liters and equipped with a gas flow sputtering source comprising metallic cerium or yttrium targets, respectively (purity>99.9%).

The substrate holder was movable in horizontal direction thus allowing the substrate, i.e. the discs, to be kept in an unexposed state while conditioning the sputtering source and further allowing an oscillation movement during sputtering in order to coat a relatively large area of the discs in a uniform manner. The substrate holder was further equipped with a ceramic radiant heater, thus allowing setting the discs to a predetermined temperature. The discs were arranged on the substrate holder using conductive pads commonly used in the field of scatter-electron microscopy.

The following commercially available devices were used:
Source generator: ENI DC-Generator DCG100, max. 10 kW
Heat generator: Electronic Measurements power supply unit
Movement controller: ISEL CNC-Controller C10C-E/A
Gas flow controller: MKS Multi-Gas Controller 647B
Temperature controller: KS 90-1 temperature controller The process parameters were typically set as follows:
Sputter target cerium: purity>99.9%
Sputter target yttrium: purity>99.9%
Target dimensions: hollow cylinder (length: 60 mm; inner diameter: 40 mm)

Typically, the sputtering step can be divided into four steps, i.e. pre-heating, conditioning of the source, applying of the coating and cooling.

In this regard, the specific process parameters used for the sputtering of the discs with cerium, and yttrium, respectively, (metallic coating) and with ceria (cerium oxide) and yttria (yttrium oxide), respectively, (oxidic coating) is given in Table 1.

TABLE 1

| Process parameter | Conditioning | Metallic coating | Oxidic coating |
|---|---|---|---|
| Argon gas flow | 850 sccm | 850 sccm | 850 sccm |
| Oxygen gas flow | 0 sccm | 0 sccm | 5 sccm |
| Operating pressure | 0.42 mbar | 0.42 mbar | 0.42 mbar |
| Source power | — | 200 W | 200 W |
| Substrate temperature | 80° C. | 80° C. | 80° C. |
| Bias voltage | — | — | — |
| Bias frequency | — | — | — |
| Duration of application of coating | 30 min | 3 to 200 s | 3 to 200 s |

Coatings having a thickness of 5 nm, 25 nm, and 125 nm have been prepared using a relatively low coating rate of less than 50 nm/s. The respective samples are given in Table 2.

TABLE 2

| Sample No. | Coating | Duration of application of coating | Coating thickness (nm) |
|---|---|---|---|
| 23 | Ce | 150 | 125 |
| 24 | Ce | 30 | 25 |
| 25 | Ce | 6 | 5 |
| 27 | CeO | 6 | 5 |
| 28 | CeO | 30 | 25 |
| 29 | CeO | 150 | 125 |
| 34 | Y | 200 | 125 |
| 35 | Y | 40 | 25 |
| 36 | Y | 6 | 5 |
| 38 | $Y_2O_3$ | 200 | 125 |
| 39 | $Y_2O_3$ | 40 | 25 |
| 40 | $Y_2O_3$ | 6 | 5 |

All oxidic coatings were fully transparent. No, thin layer interference was detected for these samples.

The appearance of the metal coatings obtained under non-oxidative sputtering conditions depended strongly on the post-oxidation in air and differed depending on the metal applied and the thickness of the coating. All cerium coated samples became fully transparent in air, while absorbance of the yttrium coated samples depended on the thickness of the coating.

The proportion of zirconium, yttrium and cerium atoms, respectively, in the surface of the samples was determined using XPS (X-ray photoelectron spectroscopy). A non-coated disc has been used as a reference example (Ref.). The results are given in Table 3.

TABLE 3

| Sample No. | Coating | Coating thickness (nm) | Proportion Zr (atomic %) | Proportion Y (atomic %) | Proportion Ce (atomic %) |
|---|---|---|---|---|---|
| Ref. | — | — | 96.7 | 3.3 | — |
| 23 | Ce | 125 | 0.5 | 0.0 | 99.5 |
| 24 | Ce | 25 | 3.6 | 0.5 | 96.0 |
| 25 | Ce | 5 | 13.7 | 0.0 | 86.3 |
| 27 | CeO | 5 | 33.3 | 1.1 | 65.6 |
| 28 | CeO | 25 | 6.1 | 0.4 | 93.5 |
| 29 | CeO | 125 | 1.4 | 0.2 | 98.4 |
| 34 | Y | 125 | 0.1 | 99.9 | — |
| 35 | Y | 25 | 0.7 | 99.3 | — |
| 36 | Y | 5 | 10.1 | 89.9 | — |
| 38 | $Y_2O_3$ | 125 | 0.0 | 100.0 | — |
| 39 | $Y_2O_3$ | 25 | 0.5 | 99.5 | — |
| 40 | $Y_2O_3$ | 5 | 11.6 | 88.4 | — |

Determination of Proportion of Monoclinic Phase

In order to determine the crystal structure's proportion of monoclinic phase, the coatings were further analysed by X-ray diffraction (XRD). A diffractometer of the type Bruker D8 GADDS having a fixed incidence angle of 10° and being equipped with a Co-anode (30 kV/30 mA) and a graphite primary monochromator was used. The X-ray beam was focussed on the sample using 500 μm monocapillary optics with a 300 μm aperture.

Analysis of the diffraction patterns was performed in correspondence with DIN V ENV 14273 according to the method of Toraya et al, Calibration curve for quantitative analysis of the monoclinic tetragonal $ZrO_2$ system by X-rays diffraction, J. Am. Ceram. Soc., 1984, 67: 119-21.

The proportion of monoclinic phase can thus be determined according to the following equation:

$$m = \frac{I_m(\bar{1}11) + I_m(111)}{I_m(\bar{1}11) + I_m(111) + I_t(101)}$$

whereby $I_m(111)$ and $I_m(-111)$ refers to the monoclinic main reflexes and $I_t(101)$ refers to the tetragonal main reflex. The proportion of monoclinic phase in the surface area of the samples is given in Table 4:

TABLE 4

| Sample No. | Coating | Coating thickness (nm) | Proportion of monoclinic phase (%) |
|---|---|---|---|
| Ref. | — | — | 3.6 |
| 23 | Ce | 125 | 13.0 |
| 24 | Ce | 25 | 5.8 |
| 25 | Ce | 5 | 5.8 |
| 27 | CeO | 5 | 5.9 |
| 28 | CeO | 25 | 11.0 |
| 29 | CeO | 125 | 11.5 |
| 34 | Y | 125 | 4.1 |
| 35 | Y | 25 | 4.9 |
| 36 | Y | 5 | 4.9 |
| 38 | $Y_2O_3$ | 125 | 9.7 |
| 39 | $Y_2O_3$ | 25 | 4.4 |
| 40 | $Y_2O_3$ | 5 | 4.2 |

The relatively high proportion of monoclinic phase for samples No. 23, 28, 29 and 38 seems to be an artefact and can be explained by the presence of a further phase (presumably $CeO_2$ and $Y_2O_3$, respectively).

Thermal Treatment

The samples were thermally treated by heating them to a temperature of about 1250° C. for 3 hours. Heating was performed in an oven (of Mihm-Vogt GmbH & Co. KG). The temperature was set only slightly below the sintering temperature of the basic material (being at about 1280° C.) in order to achieve an as high as possible diffusion of the coating material into the material of the basic body.

The samples were then analysed using the methods outlined above, in particular XPS and XRD.

Regarding the XPS analysis of the thermally treated samples, the results are given in Table 5:

TABLE 5

| Sample No. | Coating | Coating thickness (nm) | Proportion Zr (atomic %) | Proportion Y (atomic %) | Proportion Ce (atomic %) |
|---|---|---|---|---|---|
| Ref. T | — | — | 88.4 | 11.6 | — |
| 23 T | Ce | 125 | 47.7 | 9.5 | 42.8 |
| 24 T | Ce | 25 | 75.0 | 12.4 | 12.6 |
| 25 T | Ce | 5 | 85.3 | 12.6 | 2.1 |
| 27 T | CeO | 5 | 87.1 | 11.8 | 1.1 |
| 28 T | CeO | 25 | 77.9 | 12.2 | 9.9 |
| 29 T | CeO | 125 | 51.5 | 9.9 | 38.6 |
| 34 T | Y | 125 | 54.7 | 45.3 | — |
| 35 T | Y | 25 | 78.7 | 21.3 | — |
| 36 T | Y | 5 | 83.8 | 16.2 | — |
| 38 T | $Y_2O_3$ | 125 | 68.3 | 31.7 | — |
| 39 T | $Y_2O_3$ | 25 | 79.5 | 20.5 | — |
| 40 T | $Y_2O_3$ | 5 | 84.5 | 15.5 | — |

The results can be explained by a thermally induced diffusion of cerium, yttrium and their oxides, respectively, into the ceramic material of the basic body.

While for the cerium and cerium oxide coated samples there is only a slight dependency of the coating thickness on the resulting proportion of Ce in the ceramic material, the effect is much more pronounced for the samples coated with yttrium and yttrium oxide, respectively.

The samples were further analysed using X-ray diffraction (XRD) in order to determine the proportion of monoclinic phase. The results of the analysis are given in Table 6.

TABLE 6

| Sample No. | Coating | Coating thickness (nm) | Proportion of monoclinic phase (%) |
|---|---|---|---|
| Reference T | — | — | 0.6 |
| 23 T | Ce | 125 | 0.0 |
| 24 T | Ce | 25 | 0.0 |
| 25 T | Ce | 5 | 0.0 |

TABLE 6-continued

| Sample No. | Coating | Coating thickness (nm) | Proportion of monoclinic phase (%) |
|---|---|---|---|
| 27 T | CeO | 5 | 0.0 |
| 28 T | CeO | 25 | 0.0 |
| 29 T | CeO | 125 | 0.0 |
| 34 T | Y | 125 | 0.0 |
| 35 T | Y | 25 | 0.0 |
| 36 T | Y | 5 | 0.6 |
| 38 T | $Y_2O_3$ | 125 | 0.0 |
| 39 T | $Y_2O_3$ | 25 | 0.0 |
| 40 T | $Y_2O_3$ | 5 | 0.7 |

Hydrothermal aging of the samples was simulated according to ISO 13356 for 5 hours at 135° C. in an autoclave (Systec DE-56). The samples treated according to this accelerated aging procedure were analysed by X-ray diffraction (XRD) as outlined above and by field emission scanning electron microscopy (FE-SEM).

The results of the XRD analysis are given in Table 7.

TABLE 7

| Sample No. | Coating | Coating thickness (nm) | Proportion Y (atomic %) | Proportion Ce (atomic %) | Proportion of monoclinic phase (%) |
|---|---|---|---|---|---|
| Reference A | — | — | 3.3 | — | 34.5 |
| Reference TA | — | — | 11.6 | — | 30.9 |
| 23 TA | Ce | 125 | 9.5 | 42.8 | 6.3 |
| 24 TA | Ce | 25 | 12.4 | 12.6 | 13.5 |
| 25 TA | Ce | 5 | 12.6 | 2.1 | 26.4 |
| 27 TA | CeO | 5 | 11.8 | 9.9 | 27.6 |
| 28 TA | CeO | 25 | 12.2 | 38.6 | 14.7 |
| 29 TA | CeO | 125 | 9.9 | — | 5.3 |
| 34 TA | Y | 125 | 45.3 | — | 0.0 |
| 35 TA | Y | 25 | 21.3 | — | 1.9 |
| 36 TA | Y | 5 | 16.2 | — | 20.1 |
| 38 TA | $Y_2O_3$ | 125 | 31.7 | — | 0.0 |
| 39 TA | $Y_2O_3$ | 25 | 20.5 | — | 3.4 |
| 40 TA | $Y_2O_3$ | 5 | 15.5 | — | 26.1 |

As given in Table 7, a proportion of monoclinic phase of less than 20% is achieved for all samples which prior to the heating have a coating thickness of at least 25 nm.

Based on the results given in Table 7, the phase transformation behaviour of samples having a surface region enriched in cerium or yttrium, respectively, is further shown in the figures of which

DETAILED DESCRIPTION

Figure 1:
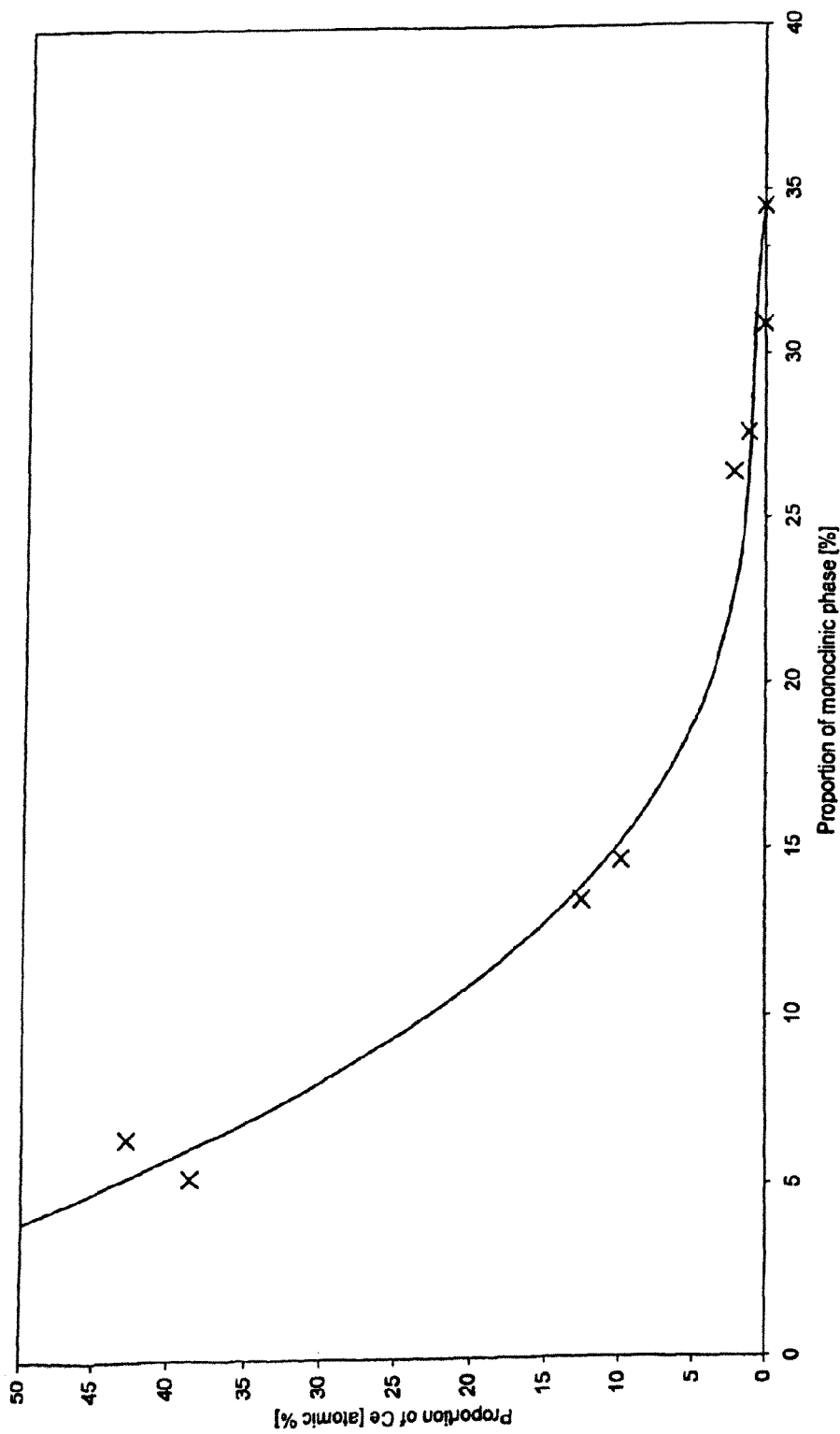
FIG. 1 shows a graphical representation of the proportion of cerium in the surface of samples 23 TA to 29 TA as a function of the proportion of monoclinic phase.
Figure 2:
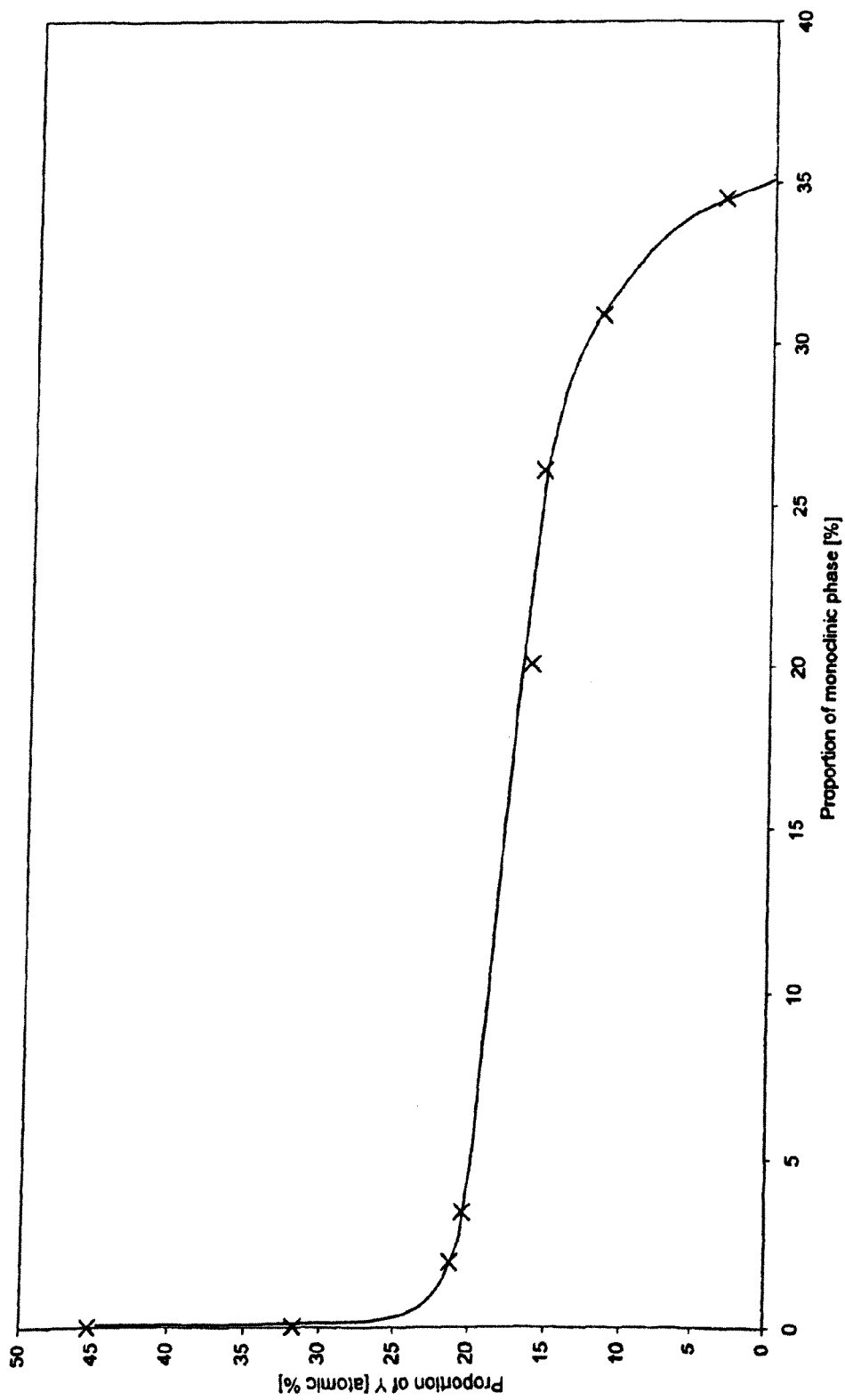
FIG. 2 shows a graphical representation of the proportion of yttrium in the surface of samples 34 TA to 40 TA as a function of the proportion of monoclinic phase.

As is apparent from the figures, the phase transformation behaviour is completely different between the yttrium enriched samples and the cerium enriched samples. Whereas for the yttrium enriched samples, there is a threshold in the yttrium proportion in the range of about 15 to 20% starting from which the proportion of monoclinic phase readily falls to a value below 5%, the cerium enriched samples show a strong effect at a relatively low proportion of cerium which is continuously decreasing with increasing the proportion of cerium.

For the cerium- or ceria-enriched samples, a proportion of monoclinic phase of less than 20% is achieved if the proportion of stabilizing agent is higher than about 5 atomic %, whereas for the yttrium or yttria-enriched samples a proportion of monoclinic phase of less than 20% is achieved if the proportion of stabilizing agent is higher than about 20 atomic %.

As mentioned above, yttrium or yttria is preferably applied on the basic body if the latter is made of yttria-stabilized zirconia. As given in the examples, the proportion of yttrium in the surface is thereby preferably in the range from 20 to 25 atomic percents, thus allowing for obtaining a fully stabilized zirconia ceramic body. 20 to 25 atomic percents of yttrium can be achieved by applying an yttrium or yttria coating prior to the heating, said coating having a thickness ranging from 20 to 30 nm.

The invention claimed is:

1. An implant comprising a ceramic body comprising:
a ceramic material comprising a stabilizing agent;
a surface region extending from a surface of the body to a predetermined depth below the surface, the surface region being composed of the ceramic material comprising the stabilizing agent; and
a remaining portion of the ceramic body that is not the surface region, the remaining portion being composed of the same ceramic material comprising the same stabilizing agent as the surface region;
wherein:
a proportion of the stabilizing agent with respect to the ceramic material in the surface region continuously increases from the predetermined depth to the surface; and the implant is a dental implant.

2. The implant according to claim 1, wherein in the surface region the proportion of the stabilizing agent is higher than that in the remainder of the body.

3. The implant according to claim 1, wherein the stabilizing agent is selected from the group consisting of yttrium, cerium, and their respective oxides.

4. The implant according to claim 1, wherein the surface region extends from the surface of the body to a depth of at least 20 nm.

5. The implant according to claim 1, wherein at least a part of the surface of the body has a surface roughness.

6. The implant according to claim 1, wherein the ceramic material comprises zirconia.

7. The implant according to claim 6, wherein the zirconia is yttria-stabilized.

8. The implant according to claim 1, wherein a molar ratio of a monoclinic phase of a crystal structure of the ceramic material in the surface region with respect to a total amount of the ceramic material in the surface region is at most as high as a molar ratio of the monoclinic phase of the crystal structure of the ceramic material in the remaining portion of the ceramic body with respect to a total amount of the ceramic material in the remaining portion of the ceramic body.

9. The implant according to claim 8, wherein the molar ratio of a monoclinic phase of a crystal structure of the ceramic material in the surface region with respect to a total amount of the ceramic material in the surface region is less than 20%.

10. A process for preparing the implant according to claim 1, said process comprising the steps of applying a stabilizing agent to a surface of a ceramic body comprising a ceramic material and heating the ceramic body with the stabilizing agent applied thereon at a temperature such that at least a portion of the stabilizing agent diffuses into the ceramic material.

11. The process according to claim 10, further comprising the step of roughening at least a part of the surface of the ceramic body by a subtractive treatment before applying the stabilizing agent.

12. The process according to claim 11, wherein the subtractive treatment comprises an etching step.

13. The process according claim 12, wherein the subtractive treatment further comprises a sand-blasting step prior to the etching step.

14. The process according to claim 10, wherein the stabilizing agent is applied to the surface of the ceramic body by a sol-gel process, by chemical vapour deposition, by physical vapour deposition, and/or by ion implantation.

15. The implant according to claim 1 made by a process comprising the steps of applying a stabilizing agent to the surface of the ceramic body comprising a ceramic material and heating the ceramic body with the stabilizing agent applied thereon at a temperature such that at least a portion of the stabilizing agent diffuses into the ceramic material.

16. An implant comprising a ceramic body comprising:
a ceramic material comprising a stabilizing agent;
a surface region extending from the surface of the body to a predetermined depth below the surface, the surface region being composed of the ceramic material comprising the stabilizing agent; and
a remaining portion of the ceramic body that is not the surface region, the remaining portion being composed of the same ceramic material comprising the same stabilizing agent as the surface region;
wherein:
a molar ratio of a monoclinic phase of a crystal structure of the ceramic material in the surface region with respect to a total amount of the ceramic material in the surface region is less than a molar ratio of the monoclinic phase of the crystal structure of the ceramic material in the remaining portion of the ceramic body with respect to a total amount of the ceramic material in the remaining portion of the ceramic body; and the implant is a dental implant.

17. The implant of claim 1, wherein the surface region extends from the surface of the body to a depth of at least 50 nm.

* * * * *